United States Patent
Guidry et al.

(10) Patent No.: US 11,594,625 B2
(45) Date of Patent: Feb. 28, 2023

(54) III-N TRANSISTOR STRUCTURES WITH STEPPED CAP LAYERS

(71) Applicant: The Regents of the University of California, Oakland, CA (US)

(72) Inventors: Matthew Guidry, Goleta, CA (US); Stacia Keller, Santa Barbara, CA (US); Umesh K. Mishra, Montecito, CA (US); Brian Romanczyk, Santa Barbara, CA (US); Xun Zheng, Santa Barbara, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 16/802,388

(22) Filed: Feb. 26, 2020

(65) Prior Publication Data
US 2020/0273974 A1    Aug. 27, 2020

Related U.S. Application Data

(60) Provisional application No. 62/810,807, filed on Feb. 26, 2019.

(51) Int. Cl.
*H01L 29/778* (2006.01)
*H01L 29/20* (2006.01)
*H01L 29/66* (2006.01)

(52) U.S. Cl.
CPC ...... *H01L 29/7786* (2013.01); *H01L 29/2003* (2013.01); *H01L 29/66462* (2013.01)

(58) Field of Classification Search
CPC ........... H01L 29/7783; H01L 29/42316; H01L 29/4232; H01L 29/0657; H01L 29/0843; H01L 29/7786; H01L 29/0684; H01L 29/0607; H01L 29/122–127; H01L 29/15–158; H01L 29/6656; H01L 29/66431; H01L 29/6653; H01L 29/66719; H01L 29/778–7789; H01L 29/7816; H01L 29/808; H01L 29/812; H01L 29/1029; H01L 29/155; H01L 29/205; H01L 29/7787; H01L 29/2003; H01L 29/66462; H01L 29/41766; H01L 29/4236; H01L 29/7781; H01L 2924/13064; H01L 23/28;
(Continued)

(56) References Cited

U.S. PATENT DOCUMENTS 6,144,048 A * 11/2000 Suemitsu .......... H01L 29/42316
257/E29.127
2011/0057257 A1 * 3/2011 Park .................... H01L 29/7787
438/270
(Continued)

OTHER PUBLICATIONS

Romanczyk et al., "Demonstration of Constant 8 W/mm Power Density at 10, 30, and 94 GHz in State-of-the-Art Millimeter-Wave N-Polar GaN MISHEMTs," IEEE Trans. Electron Devices, vol. 65, No. 1, pp. 45-50, 2018.
(Continued)

*Primary Examiner* — Natalia A Gondarenko
(74) *Attorney, Agent, or Firm* — Gates & Cooper LLP

(57) ABSTRACT

Described herein are III-N (e.g. GaN) devices having a stepped cap layer over the channel of the device, for which the III-N material is orientated in an N-polar orientation.

25 Claims, 11 Drawing Sheets

(58) Field of Classification Search
CPC ............... H01L 23/291; H01L 23/3171; H01L 23/3192
USPC ..... 257/77, 76, 192, 194, 195, 183, E29.104
See application file for complete search history.

(56) References Cited

U.S. PATENT DOCUMENTS

| | | | |
|---|---|---|---|
| 2011/0169014 A1* | 7/2011 | Yamaki | H01L 29/66462 257/77 |
| 2012/0187452 A1* | 7/2012 | Saito | H01L 29/66462 257/E29.091 |
| 2013/0026489 A1* | 1/2013 | Gambin | H01L 29/66462 257/77 |
| 2017/0054015 A1* | 2/2017 | Nakata | H01L 29/7786 |
| 2017/0092752 A1* | 3/2017 | Lu | H01L 29/7783 |

OTHER PUBLICATIONS

Wienecke et al., "N-polar GaN cap MISHEMT with record power density exceeding 6.5 W/mm at 94 GHz," IEEE Electron Device Lett., vol. 38, No. 3, pp. 359-362, 2017.
Wu et al., "40-W/mm Double Field-plated GaN HEMTs," in 64th Device Research Conference, 25 2006, pp. 151-152.

* cited by examiner

III-N TRANSISTOR STRUCTURES WITH STEPPED CAP LAYERS

CROSS REFERENCE TO RELATED APPLICATIONS

This application claims the benefit under 35 U.S.C § 119(e) of commonly-assigned provisional application Ser. No. 62/810,807, entitled "III-N Transistor Structure with Stepped Cap Layers," filed on Feb. 26, 2019, by Matthew Guidry, Stacia Keller, Umesh K. Mishra, Brian Romanczyk, and Xun Zheng, which application is incorporated by reference herein.

STATEMENT REGARDING FEDERALLY SPONSORED RESEARCH AND DEVELOPMENT

This inventikon was made with Government support under Grant No. N00014-18-1-2049 awarded by the Office of Naval Research (ONR). The Government has certain rights in this invention.

TECHNICAL FIELD

The disclosed technologies relate to semiconductor devices, in particular III-Nitride transistors and switches.

BACKGROUND

Description of the Related Art (Note: This application references a number of different publications as indicated throughout the specification by one or more reference numbers in brackets, e.g., [x]. A list of these different publications ordered according to these reference numbers can be found below in the section entitled "References." Each of these publications is incorporated by reference herein.)

High-electron mobility transistors (HEMTs) are solid-state electron devices made from a semiconductor heterostructure that are widely used to amplify high-frequency signals. They operate by biasing a gate electrode to modulate a sheet of electrons ($n_s$) in the form of a two-dimensional electron gas (2DEG) which is confined to a layer in the heterostructure referred to as a device channel.

III-N or III-Nitride based HEMTs have great capacity in high-power, high-frequency applications due to their wide band gap and the reasonably high density and high mobility of the 2DEGs formed at the (Al,Ga,In)N/GaN hetero-interface.

Typical III-N high electron mobility transistors (HEMTs) and related devices are formed on III-Nitride materials grown in a group-III polar (e.g., Ga-polar) orientation, such as the [0 0 0 0 1] (C-plane) orientation. That is, the source, gate, and drain contacts of the HEMT are formed over the group-III face (e.g., [0 0 0 0 1] face) of the III-N material layers, which is typically on an opposite side of the III-N material layers from the substrate on which the III-N layers are formed. Alternatively, III-N HEMTs can be formed on III-Nitride materials grown in an N-Polar (i.e., N-face) orientation, such as the [0 0 0 0 −1] orientation. In this case, the source, gate, and drain contacts of the HEMT are formed over the N-face (e.g., [0 0 0 0 −1] face) of the III-N material layers. N-polar III-N materials have polarization fields with opposite direction to group-III polar III-N materials, and thus can enable the implementation of III-N devices which cannot be fabricated using group-III polar structures. N-polar III-N devices can in some cases exhibit superior characteristics when compared to group-III polar devices, including lower static and dynamic on-resistance, with higher current density, higher power density, and higher reliability.

N-polar deep recess HEMTs have demonstrated exceptionally large signal operation at 94 GHz where the output power density can be up to four times larger than traditional Ga-polar HEMT structures [1]. While this is a very promising result, it is significantly smaller than the output power that has been demonstrated at 4 GHz by a Ga-polar HEMTs utilizing field plates [3]. Incorporating field plates into the device structure of the Ga-polar HEMTs helps to reduce the peak electric fields in the device, thus providing the ability to operate the device at higher voltages. At higher operational frequencies, such as mm-wave frequencies, the use of field plates is not practical given the additional capacitances that these structures introduce which ultimately limits the gain of the transistor. Therefore, an alternate structure for reducing the peak electric field in N-polar HEMTs when used in high frequency applications would be desirable.

A cross-sectional view of an N-polar III-N device 100 of the prior art can be seen in FIG. 1. The device 100 includes a III-N buffer layer 2 over a substrate 1. An AlGaN back-barrier layer 3 is over the buffer layer 2 followed by a III-N channel layer 4. A compositional difference between the back-barrier layer 3 and the channel layer 4 induces the formation of a two-dimensional electron gas (2DEG) channel 19 in the channel layer 4 which electrically connects to the source electrode 6 and the drain electrode 7. A gate electrode 5, positioned between the source electrode 6 and the drain electrode 7, is used to modulate the electron charge in the 2DEG channel 19 beneath the gate through the application of voltage to the gate. The region below the gate electrode 5, in region 81, is referred to as the gate region of the device. The region between the gate electrode 5 and the source electrode 6, and the region between the gate electrode 5 and the drain electrode 7, are referred to as the device access regions, where region 82 is the source-side access region and region 83 is the drain-side access region. All III-N layers are formed as N-polar layers (i.e., having a III-face proximal to the substrate 1 and an N-face opposite the substrate).

SUMMARY

Described herein are III-N devices having stepped cap layers formed over the III-N channel layer, for which the III-N material is orientated in an N-polar orientation. The device structures with stepped cap layers can obtain higher breakdown voltages by providing a means of reducing the electric field in the channel by modulating the channel charge laterally throughout the device access regions. The details of one or more embodiments of the subject matter described in this specification are set forth in the accompanying drawings and the description below. Other features, aspects, and advantages of the subject matter will become apparent from the description, the drawings, and the claims.

In a first aspect, a III-N device is described. The III-N device includes a III-N channel layer over an N-face of a III-N barrier layer, the III-N channel layer having a smaller bandgap than the III-N barrier layer. The device further includes a first III-N cap layer over an N-face of the III-N channel layer, the first III-N cap layer having a larger bandgap than the III-N channel layer. The device further includes a second III-N cap layer over an N-face of the first III-N cap layer, where a portion of the second III-N cap layer adjacent to the first III-N cap layer has a smaller bandgap than the first III-N cap layer. The device further includes a gate contact between a source and a drain contact, and the gate contact is at least partially in a recess in the second III-N cap layer. The second cap layer includes a first region and a second region, where the first region has a first end in contact with the gate contact and directly adjacent to a bottom surface of the recess and a second end between the first end and the drain contact, and the second region is directly adjacent to the first region and is between the first region and the drain contact. The Thickness of the second cap layer in the first region is everywhere less than a thickness of the second cap layer in the second region, and a lateral separation between the first end and the second end is greater than 25 nanometers.

In a second aspect, electronic device is described. The electronic device comprises a III-N material structure. The III-N material structure comprises a III-N channel layer over a III-N barrier layer and a III-N cap layer over the III-N channel layer, where a compositional difference between the III-N barrier layer and the III-N channel layer causes a 2DEG channel to be induced in the III-N channel layer. The device further includes a gate contact between a source and a drain contact, where the gate contact is over an N-face of the III-N material structure and is at least partially in a recess in the III-N cap layer. The III-N material structure in a drain side access region of the device includes a first region and a second region, where the first region has a first end in contact with the gate and directly adjacent to a bottom surface of the recess and a second end between the first end and the drain contact, and the second region is directly adjacent to the first region and is between the first region and the drain contact. The thickness of the III-N cap layer in the first region is everywhere less than a thickness of the III-N cap layer in the second region, and a charge density of the 2DEG channel in the first region is everywhere less than a charge density of the 2DEG channel the second region.

In a third aspect, a method of forming a III-N device is described. The method comprises providing a III-N material structure comprising a III-N channel layer over an N-face of a III-N barrier layer, where the III-N channel layer has a smaller bandgap than the III-N barrier layer. The method further comprises forming a first III-N cap layer over an N-face of the III-N material structure, and forming a second III-N cap layer over an N-face of the first III-N cap layer, where the second III-N cap layer has a smaller bandgap than the first III-N cap layer. The method further comprising forming a source contact and a drain contact to the III-N material structure. The method further comprising patterning a masking layer over the second III-N cap layer, the masking layer including an opening between the source contact and the drain contact, and etching the second III-N cap layer below the opening in the masking layer to form a recess therein, and depositing a gate contact at least partially in the recess. The second cap layer includes a first region and a second region, where the first region has a first end in contact with the gate contact directly adjacent to a bottom surface of the recess and a second end between the first end and the drain contact, and the second region is directly adjacent to the first region and is between the first region and the drain contact. The thickness of the second III-N cap layer increases monotonically from the first end to the second end, and a lateral separation between the first end and the second end is at least 25 nanometers.

As used herein, the terms III-Nitride or III-N materials, layers, devices, etc., refer to a material or device comprised of a compound semiconductor material according to the stoichiometric formula $B_wAl_xIn_yGa_zN$, where w+x+y+z is about 1 with $0 \leq w \leq 1$, $0 \leq x \leq 1$, $0 \leq y \leq 1$, and $0 \leq z \leq 1$. III-N materials, layers, or devices, can be formed or prepared by either directly growing on a suitable substrate (e.g., by metal organic chemical vapor deposition), or growing on a suitable substrate, detaching from the original substrate, and bonding to other substrates. A III-N device can be designed to operate as a transistor or switch in which the state of the device is controlled by a gate terminal or as a two terminal device that blocks current flow in one direction and conducts in another direction without a gate terminal. The III-N device can be a high frequency device utilized for power amplification applications at mm-wave frequencies.

As used herein, two or more contacts or other items such as conductive channels or components are said to be "electrically connected" if they are connected by a material which is sufficiently conducting to ensure that the electric potential at each of the contacts or other items is intended to be the same, e.g., is about the same, at all times under any bias conditions.

As used herein, "blocking a voltage" refers to the ability of a transistor, device, or component to prevent significant current, such as current that is greater than 0.001 times the operating current during regular conduction, from flowing through the transistor, device, or component when a voltage is applied across the transistor, device, or component. In other words, while a transistor, device, or component is blocking a voltage that is applied across it, the total current passing through the transistor, device, or component will not be greater than 0.001 times the operating current during regular conduction. Devices with off-state currents which are larger than this value exhibit high loss and low efficiency, and are typically not suitable for many applications, especially power switching applications.

As used herein, a "III-polar" or "group-III polar" III-N material is a III-N material for which the group-III face (i.e., the [0 0 0 1] face) is opposite the substrate on which the material is grown. In a "III-polar" or "group-III polar" lateral III-N device, at least some of the device contacts (e.g., the source and/or drain contacts) are typically formed on a [0 0 0 1] face of the III-N material (e.g., on a side opposite the [0 0 0 0 −1] face).

As used herein, an "N-polar" III-N material is a III-N material for which the Nitrogen face (i.e., the [0 0 0 0 −1] face) is opposite the substrate on which the material is grown. In an "N-polar" lateral III-N device, at least some of the device contacts (e.g., the source and/or drain contacts) are typically formed on a [0 0 0 0 −1] face of the III-N material (e.g., on a side opposite the [0 0 0 0 1] face).

The terms "over," "under," "between," and "on" as used herein refer to a relative position of one layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

The details of one or more disclosed implementations of the subject matter described in this specification are set forth in the accompanying drawings and the description below. Additional features and variations may be included in the implementations as well. Other features, aspects, and advantages will become apparent from the description, the drawings and the claims.

DESCRIPTION OF DRAWINGS

Referring now to the drawings in which like reference numbers represent corresponding parts throughout.

DETAILED DESCRIPTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.
Technical Description Described herein are III-N (e.g. GaN) devices and transistors designed to address challenges observed with N-polar GaN HEMTs utilized for power amplification applications. The III-N device can have stepped cap layers above the channel layer of the device to shape the channel charge profile near the gate, thereby increasing the device breakdown voltage and improving the overall device performance.

In the case of N-polar GaN deep recess HEMTs [1], it has been observed that for small gate-to-drain spacings $L_{GD}$ the measured breakdown voltage scales with the critical breakdown field of GaN (330 V/µm) and then saturates for longer $L_{GD}$. This saturation is expected in a field effect transistor structure and implies that the critical electric field is reached in a distance shorter than $L_{GD}$. Embodiments of the invention disclosed herein can overcome this limit and obtain higher breakdown voltages by providing a means of reducing the electric field in the channel by modulating the channel charge laterally throughout the access region of the device.

Figure 1:
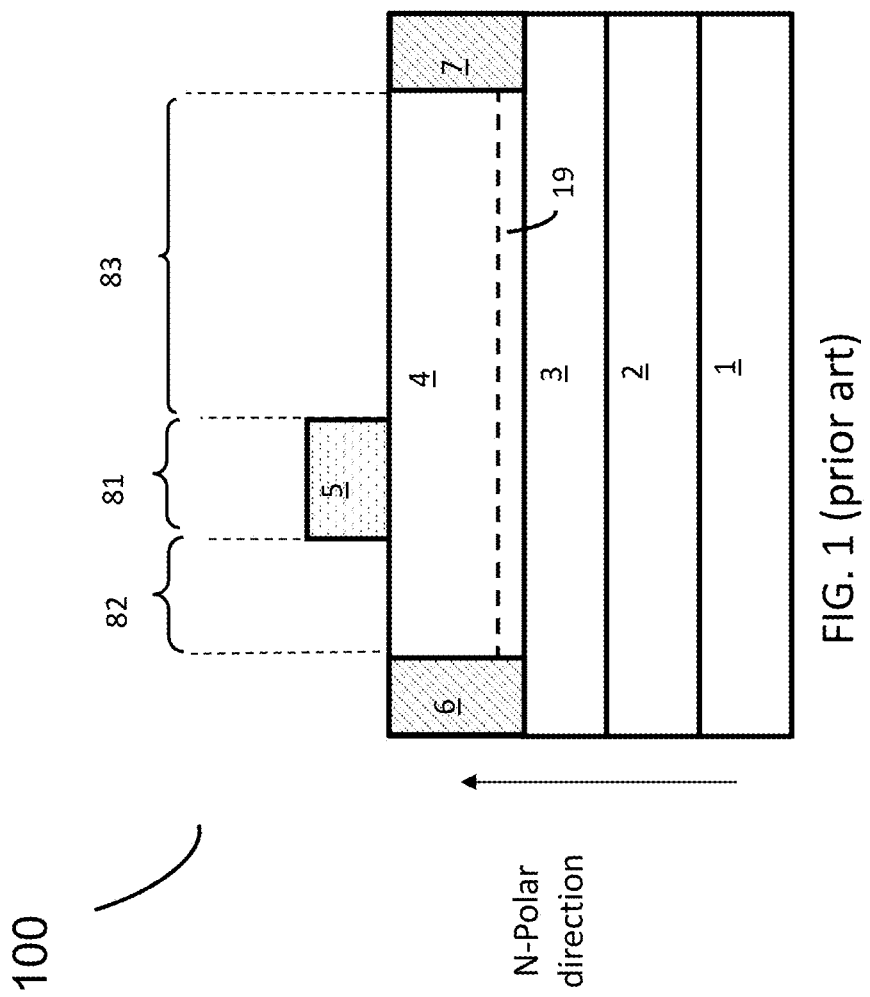
FIG. 1 is a cross-sectional view of an N-polar device of the prior art.
Figure 2:
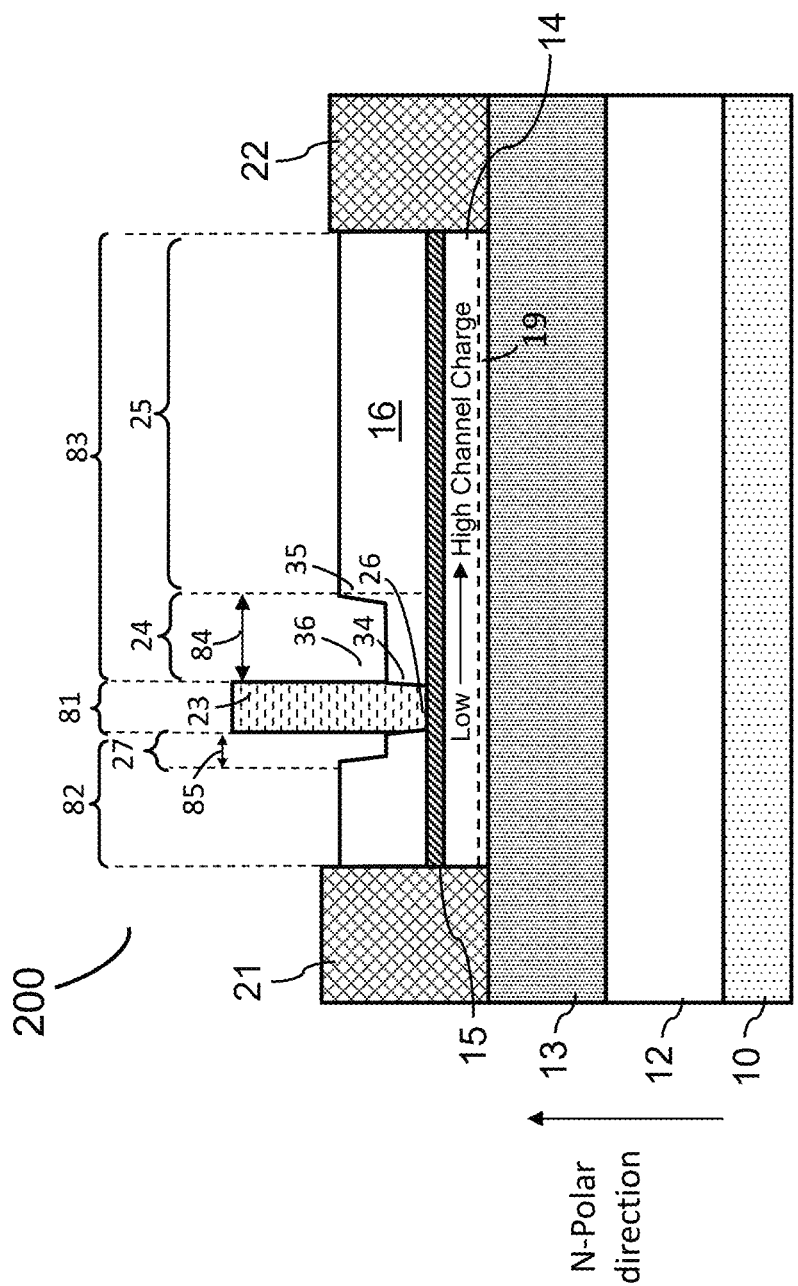
FIG. 2. is a cross-sectional view of a III-N device according to one or more embodiments described herein.

A cross-sectional view of a first embodiment of the present invention is shown in FIG. 2. The device 200 of FIG. 2 is an N-polar device which includes an N-polar III-N material structure. The III-N material structure is formed via an epitaxial (epi) growth of the III-N layers, typically by metal organic chemical vapor deposition (MOCVD). The III-N material structure includes a III-N buffer layer 12, for example GaN or AlGaN, grown on a suitable substrate 10, which can for example be silicon (Si), silicon carbide (SiC), sapphire, AlN, or GaN. The substrate can be electrically conductive (e.g., p-type Si), electrically semi-insulating (e.g., SiC), or electrically insulating (e.g. sapphire). The substrate can have high thermal conductivity (e.g. SiC) or low thermal conductivity (e.g., sapphire). In some implementations the substrate 10 may be omitted, or can be removed after growth of the epitaxial layers.

The buffer layer 12 can be rendered insulating or substantially free of unintentional n-type mobile carriers by including dislocations or point defects in the layer, or by doping the layer with compensating elements, such as Fe, C, and/or Mg. The buffer layer can have a substantially uniform composition throughout, or the composition can vary. For example, in some implementations the buffer layer is compositionally graded, such as by grading the aluminum composition along a vertical axis in the buffer layer.

The III-N material structure of device 200 further includes a III-N back-barrier layer 13, for example $Al_xGa_{1-x}N$, over the III-N buffer layer 12, and a III-N channel layer 14, for example unintentionally doped (UID) GaN, over the III-N back-barrier layer 13. The bandgap of the III-N back-barrier layer 13 is greater than that of the III-N channel layer 14. The III-N channel layer 14 has a different composition than the III-N back-barrier layer 13, and the thickness and composition of the III-N back-barrier layer 13 and III-N channel layer 14 is selected such that a conductive two-dimensional electron gas (2DEG) channel 19 (indicated by the dashed line in FIG. 2) is induced in the III-N channel layer 14 adjacent the interface between layers 13 and 14. The III-N channel layer 14 can have a smaller bandgap than the III-N back-barrier layer 13. The composition of the III-N back-barrier layer 13 can be constant or can be varied throughout. In practice, layer 13 may include multiple discreet layers of different III-N material composition and/or be arbitrarily graded in composition. Parts of the III-N back-barrier layer 13 may also be modified with the addition of dopants, such as silicon used as an n-type dopant.

The III-N material structure of device 200 can optionally include a III-N top barrier layer 15 (e.g., a first cap layer, which can for example be an AlGaN layer) over the channel layer 14. The top barrier layer 15 can be present in the device access regions 82 and 83 between the source contact 21 and the drain contact 22, respectively, as well as in the gate region 81. Alternatively, the top barrier layer 15 can be present only in the gate region 81 and not in the access regions 82 and 83. The III-N top barrier layer 15 has a larger bandgap than the channel layer 14, and can act as a gate barrier to reduce the parasitic gate leakage of the device. The III-N top barrier layer 15 can, for example, be formed of AlN or $Al_xGa_{1-x}N$, where x can be in a range of 0.1 to 1. The thickness of the III-N top barrier layer can be at least thicker than a monolayer of the III-N material from which it is formed. In one example, the III-N top barrier layer has a thickness between 1 nm and 5 nm and is formed of $Al_xGa_{1-x}N$ with x in a range of 0.2 to 0.3 or 0.2 to 0.5.

A second III-N cap layer 16 (e.g., UID GaN) is over the channel layer 14 and on the III-N top barrier layer 15 at least in the device access regions 82 and 83. The second III-N cap layer 16 can have a smaller bandgap than the first cap layer 15. The second III-N cap layer has a recess 36 therein. A gate contact 23 is formed at least partially in the recess 36. The recess includes a bottom surface 26 that is directly beneath the gate contact 23. The gate contact 23 can be formed of suitable conducting materials such as metal stacks, e.g., aluminum (Al), titanium/aluminum (Ti/Al) or nickel/gold (Ni/Au), and can be deposited by metal evaporation or sputtering or chemical vapor deposition or various atomic layer depositions (ALD).

Source and drain contacts 21 and 22 (i.e., source and drain electrodes), respectively, are on opposite sides of the gate contact 23. The source contact 21 and drain contact 22 can be in ohmic electrical contact with the 2DEG channel 19. This contact can be achieved by several methods, including forming a recess into the III-N channel layer 14 or by doping the region below the source and drain contacts 21 and 22, for example with an n-type impurity such as silicon. The source and drain contacts can be metal stacks such as Al, Ti/Al, Ti/Al/Ni/Au, Ni/Au or the like.

The portion of the III-N material structure below the gate contact 23, in region 81, is referred to as the gate region of the device. The portions of III-N material structure between the gate contact 23 and the source contact 21, and between the gate contact 23 and the drain contact 22, are referred to as the device access regions, where region 82 is the source side access region and region 83 is the drain side access region.

As seen in FIG. 2, the recess 36 in which the gate is formed can extend through the entire thickness of the second III-N cap layer 16. The recess 36 can optionally extend at least partially through the first III-N cap layer 15 (not shown). Alternatively, the recess 36 can extend partially through the thickness of the second III-N cap layer 16 without extending through the entire thickness (not shown).

As further seen in FIG. 2, the second III-N cap layer 16 includes a first region 24 and a second region 25. The first region 24 has a first end 34 directly adjacent to the bottom surface 26 of the recess 36 and a second end 35 between the first end 34 and the drain contact 22. The first end 34 and the second end 35 in region 24 define a sidewall of the recess 36 which is formed in the drain-side access region of the device 83 or to form a recess comprising gate recess 36a and channel recess 36b. The second region 25 is directly adjacent to the first region 24 and is between the first region 24 and the drain contact 22. The thickness of the second III-N cap layer 16 in the first region 24 is everywhere less than the thickness of the second III-N cap layer 16 in the second region 25. In some implementations, the thickness of the second III-N cap layer 16 along the sidewall of the recess 36 in the first region 24 is substantially constant or increases monotonically from the first end 34 to the second end 35 (e.g., increases monotonically from the gate contact 23 towards the drain contact 22.

As used herein, a thickness of a material layer (or portion of a material layer) is considered to "increase monotonically" from a first side to a second side if the thickness everywhere either is increasing or remains substantially constant at each point from the first side to the second side.

Still referring to FIG. 2, the lateral width 84 between the first end and second end of the first region 24 can be greater than 10% of the total gate-to drain-spacing ($L_{GD}$) which is shown as the drain-side access region 83. For example, if the $L_{GD}$ of device 200 is 250 nanometers, the lateral width 84 can be greater than 25 nanometers. It has been found that including a first region 24 in the second cap layer 16, located where shown in FIG. 2, which is thin (e.g., everywhere thinner than in the second region 25, for example less than 30 nm) and which is at least 25 nm wide results in a substantial increase in the device breakdown voltage for an N-polar device, even in the absence of a field plate (this would generally not be the case in a III-polar device). Based on modeling of this device structure, it is believed that this improvement occurs because the polarization fields in the III-N material cause the 2DEG charge density to increase with increasing thickness of the second III-N cap layer 16 up to a certain critical thickness (which depends on the particular composition of the various III-N layers). Once the thickness of the second III-N cap layer 16 exceeds this critical thickness, the 2DEG charge density saturates and remains constant. Thus below region 24, the 2DEG charge density is reduced relative to below region 25. Although this reduced charge density can cause a slight increase in the device on-resistance, it also reduces the peak electric field in the device while the device is biased in the off state (even in the absence of a field plate), thereby substantially improving device performance.

As described herein, in some implementations the thickness of the second III-N cap layer 16 increases monotonically from the gate contact 23 towards the drain contact 22. This can cause the 2DEG channel charge density to increase monotonically from the drain side edge of the gate contact 23 towards the drain contact 22. In many cases, this charge configuration can be optimal for increasing the device breakdown voltage while minimizing the increase in the device on-resistance.

Methods of forming the structure of FIG. 2 typically result in a region 27 of the second III-N cap layer 16 (in the source access region 82 and adjacent to the gate contact 23) also having a smaller thickness than in region 25, which can increase the device on-resistance. It is therefore preferable that the lateral width 85 of this region be small. Accordingly, the lateral width 84 of region 24 can be greater than the lateral width 85 of region 27. For example, the lateral width 84 of region 24 can be at greater than 25 nm, and the lateral width 85 of region 27 can be at greater than 5 nm but less than the width 84 of region 24.

The average thickness of the III-N cap layer 16 in the first region 24 can be less than half the thickness of the III-N cap layer 16 in the second region 25. The thickest portion of the III-N cap layer in region 25 can be less than 60 nm and the average thickness of the III-N cap layer 16 in the first region can be less than 30 nm. As described herein, the improved performance of device 200 of FIG. 2 is achieved by adjusting the channel charge density ($n_s$) laterally within the device access regions. In this manner, the thickness of the III-N cap layer is used to control $n_s$ making use of the polarization properties of N-Polar GaN. The III-N cap layer 16 has the properties such that increasing the thickness of the III-N cap layer 16 increases the charge density $n_s$ in the 2DEG channel 19 in the region below the III-N cap layer 16 (where psi a function of III-N cap layer 16 thickness). Although the thickness of the III-N cap layer 16 could be greater than 60 nm, the increase in channel charge tends to saturate above a critical thickness, providing little additional benefit. As such the channel charge density can be engineered such that the highest channel charge density is in the regions with greatest III-N cap layer thickness. This benefits the large-signal operation of the device by providing low access resistances and controlling DC-to-RF dispersion originating from surface states. Closer to the gate contact 23 the III-N cap layer 16 is stepped down in thickness, thus reducing 2DEG channel charge density in the in that region under the III-N cap layer 16 which has been stepped down in thickness. As a result of changing the III-N cap layer 16 thickness in the region 24, the channel charge density can increase monotonically from a first channel charge density proximal to the gate contact to the second channel charge density proximal to the drain contact. The 2DEG channel charge density near the drain contact can be, for example, at least 10% higher than the 2DEG channel charge density at the first end of region 24 (i.e., adjacent to the gate contact). The reduction of $n_s$ near the gate allows higher voltages to be applied to the device prior to breakdown, enhancing the large-signal output voltage swing capability of the transistor. The reduction in III-N cap layer 16 thickness immediately adjacent to the gate contact provides further benefit of reducing the parasitic fringing capacitances, as does the reduction in $n_s$ in the 2DEG channel 19 on the drain side of the gate under reverse gate to drain voltage bias conditions. Reducing these capacitances increases the gain of the III-N device. Underneath the gate contact 23, the III-N cap layer 16 can be fully recessed to maximize the ability of the gate contact to reduce the current through the device and fully "pinch off" the channel when biased in the OFF state.

Figure 5:
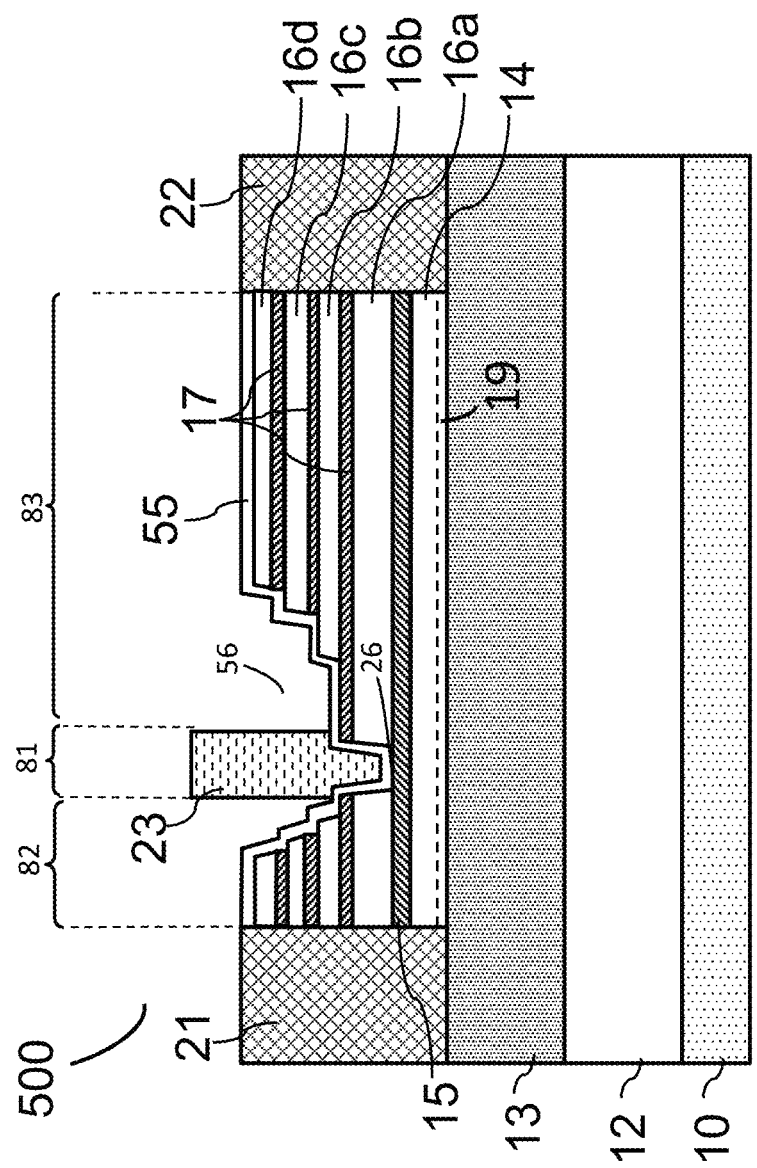
FIG. 5 is a cross-sectional view of another configuration for a III-N device according to one or more embodiments described herein.
Figure 6:
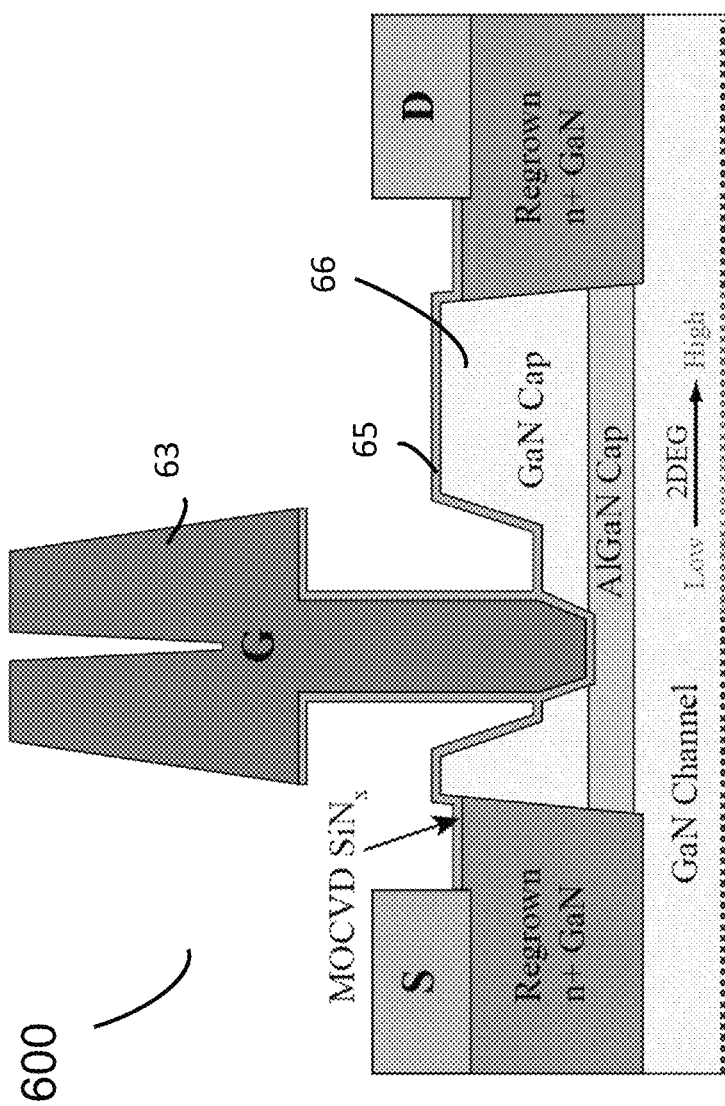
FIG. 6 is a cross-sectional view of another configuration for a III-N device according to one or more embodiments described herein.

A gate insulator layer i.e., a gate dielectric layer (not shown in FIG. 2, although shown in FIG. 5, and FIG. 6) can optionally be grown or deposited between the gate contact 23 and the III-N material structure. The gate insulator can extend continuously between the source contact 21 and the drain contact 22, such that the entire top surface of the III-N material structure is passivated by the insulator layer. The gate insulator can cover the sidewall of the recess 36 in region 24 proximal to the drain contact, the bottom surface of the recess 26, and the sidewall of the recess in region 27 proximal to the source contact (as shown in FIG. 5). Additionally, the gate insulator layer can be used to passivate the sides of the gate contact 23 (as shown in FIG. 6). The gate insulator can, for example, include aluminum oxide ($Al_2O_3$), silicon dioxide ($SiO_2$), silicon nitride ($Si_xN_y$), $Al_{1-x}Si_xN$, $Al_{1-x}Si_xO$, $Al_{1-x}Si_xON$ or any other wide bandgap insulator.

Figure 3:
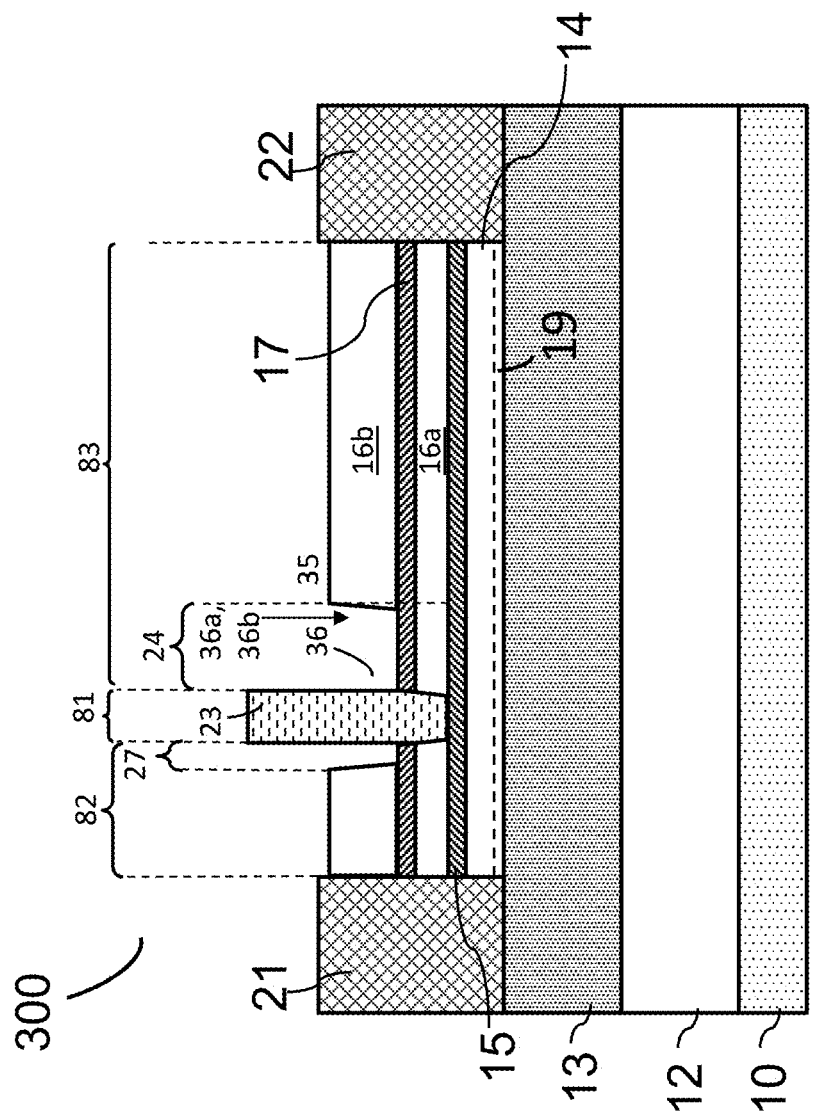
FIG. 3. is a cross-sectional view of an alternative configuration of the III-N device of FIG. 2.

An alternative embodiment of the invention is shown in FIG. 3. The device 300 of FIG. 3 is similar to the device 200 of FIG. 2 but includes an additional layer added into the III-N cap layer 16. As shown in FIG. 3, an III-N insertion layer 17 (e.g. AlGaN) is added into the III-N cap layer 16 such that the III-N cap layer includes a first portion 16a which is proximal to the III-N channel layer 14 and a second portion 16b which is above the first portion 16a. The III-N insertion layer 17 provides the ability to further engineer the charge profile in the 2DEG channel layer 19. In this embodiment, the inverted polarization between the III-N insertion layer 17 and the III-N cap layer 16b can further increase the charge density in the device channel. In addition, the III-N insertion layer 17 can enhance the manufacturability of the device structure by acting as a selective etch-stop layer. The thickness and composition of the III-N insertion layer 17 can be similar to that of the III-N top barrier layer 15. The thickness of the first portion of the III-N cap layer 16a can be similar to the thickness of the second portion of the III-N cap layer 16b, or they can be different. In order to maximize the increase of $n_s$ into the channel 19, the thickness of second portion of the III-N cap layer 16b can greater than the thickness of the first portion of the III-N 16a. For example, the thickness of the first portion 16a can be between 5 nm to 20 nm and the thickness of the second portion 16b can be between 20-30 nm. As seen in FIG. 3, the III-N insertion layer 17 can extend across the region 24 and 27 continuously to the gate contact 23, or alternatively the III-N insertion layer can be removed in region 24 and 27. Although FIG. 3 shows one III-N insertion layer 17, multiple insertion layers can be used to further provide ability to engineer the charge profile, as shown in FIG. 5.

In another embodiment of the device shown in FIG. 3, the (e.g., thin) barrier layers 15 and 17 in FIG. 3 are absent and the "shape" is created using a timed etch of a thick cap layer.

In alternate embodiments of the device shown in FIG. 2, FIG. 3, FIG. 4a-d, and FIG. 5 the barrier layer 15 is absent. The initial etch to form the "shape" is creating using a selective etch where layer 15 is an etch stop, and the remaining amount of layer 15 then removed with a different etch process which is not selective to layer 15.

A method of forming the device 300 of FIG. 3 is as follows. An N-polar III-N material structure is formed, shown in FIG. 4A. Forming the N-polar III-N material structure includes forming a III-N buffer layer 12 on a suitable substrate 10, for example on a miscut SiC substrate. The III-N buffer layer 12 can consist of forming a thin N-polar GaN nucleation layer on the substrate and a carbon-doped GaN buffer layer on the nucleation layer. The buffer layer 12 may be a single uniform layer or may consist of multiple layers of differing material properties. Next, a III-N back-barrier layer 13 is formed over the buffer layer. The III-N back-barrier layer 13 may consist of multiple discreet layers of different III-N material compositions and/or be arbitrarily graded in composition. Parts of layer 13 may also be modified with additional dopants, such as silicon. A III-N channel layer 14 is formed over the III-N back barrier layer 13, and a two-dimensional electron gas (i.e. 2DEG layer) 19 is formed at the interface between layer 13 and layer 14.

Figure 4A:
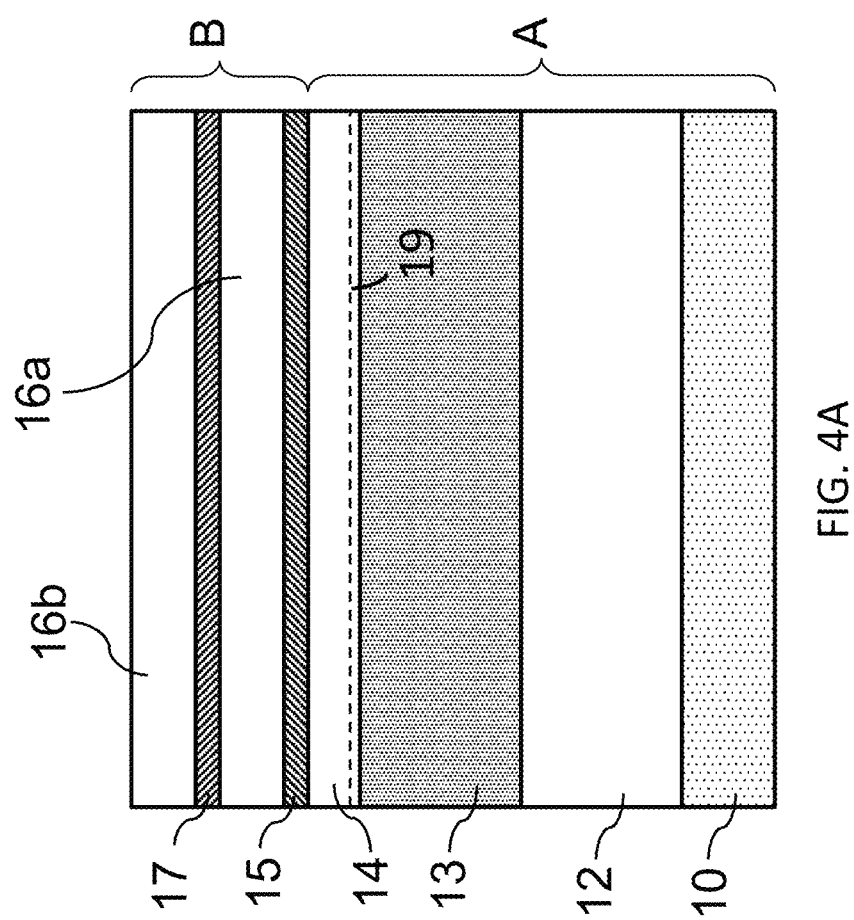
FIG. 4A-FIG. 4D show a method of manufacturing the III-N device of FIG. 3.

The base structure of the III-N material structure which forms the N-polar III-N HEMT is depicted in Region A of FIG. 4A. Region B of FIG. 4A shows the implementation of the portion of III-N material structure which is designed to achieve the benefits of device 300. Forming the III-N material structure further includes forming a III-N top barrier layer 15, for example AlGaN, on the top surface of the III-N channel layer 14. Next, a III-N cap layer 16, for example GaN, is formed over the top barrier layer 15. The material properties of the III-N cap layer 16 (e.g. polarization, composition, doping) leads to an increase in 2DEG charge density within the channel layer 14 as the thickness of the III-N cap layer 16 is increased. These properties need not be uniform throughout the thickness of the layer.

A III-N insertion layer 17, for example AlGaN, may optionally be formed within the III-N cap layer 16 so as to form cap layers 16a and 16b (i.e., layer 16a deposited, followed by layer 17, followed by deposition of layer 16b). This layer may act as an etch stop layer to assist in the manufacturing process. No restriction is placed on this layer in regard to its impact on the 2DEG channel charge. Although FIG. 4A specifically shows one III-N insertion layer 17, fewer or more of these layers may exist. The exact material properties of each insertion layer may be different.

Figure 4B:
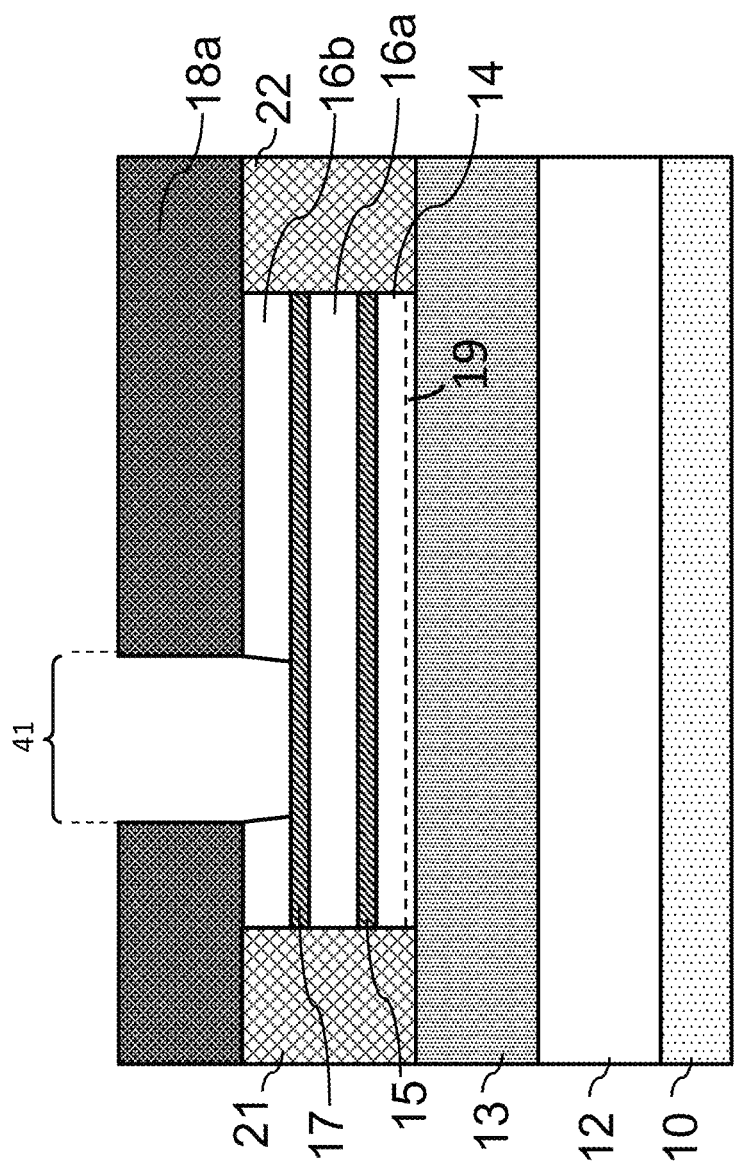

FIG. 4B depicts some of the first manufacturing steps used to create the III-N device. Outside of the access regions of the device, the source and drain contacts 21 and 22 are formed. These source and drain contacts are conductive materials that provide an electrical connection to the 2DEG channel 19. The material of the III-N layers in the source and drain regions can be n-type doped III-N layers produced by epitaxial regrowth or through ion implantation. The material in the source and drain contacts may also be metal stacks, or a stack of metals alloyed with the III-N material structure to create electrical contact to the III-N channel layer 14 and the 2DEG channel 19. The source and drain contacts 21 and 22 may or may not be in physical contact with the adjacent III-N materials such as layer 16 and layer 17. The formation of the source and drain contacts can occur before or after the formation of the gate recess.

A masking layer 18a is patterned over the top surface of the device to create an opening with a width over the III-N cap layer 16b, between the source and drain contact. The III-N cap layer 16b is then removed to form a first recess 41, which at least includes the gate region 81 of the device as well as portions of the device access regions to create a vertical (or semi-vertical or slanted) side portion in the III-N cap layer 16*b*. The selective removal process can be carried out by means of dry-etch techniques or the removal of the III-N cap layer 16*b* can be carried out by means of wet-etch techniques, or by a combination of dry-etch and wet-etch techniques. The exposed III-N insertion layer 17 may either be left in place, as shown in FIG. 4B, or may be fully or partially removed in the bottom of the first recess 41.

Figure 4C:
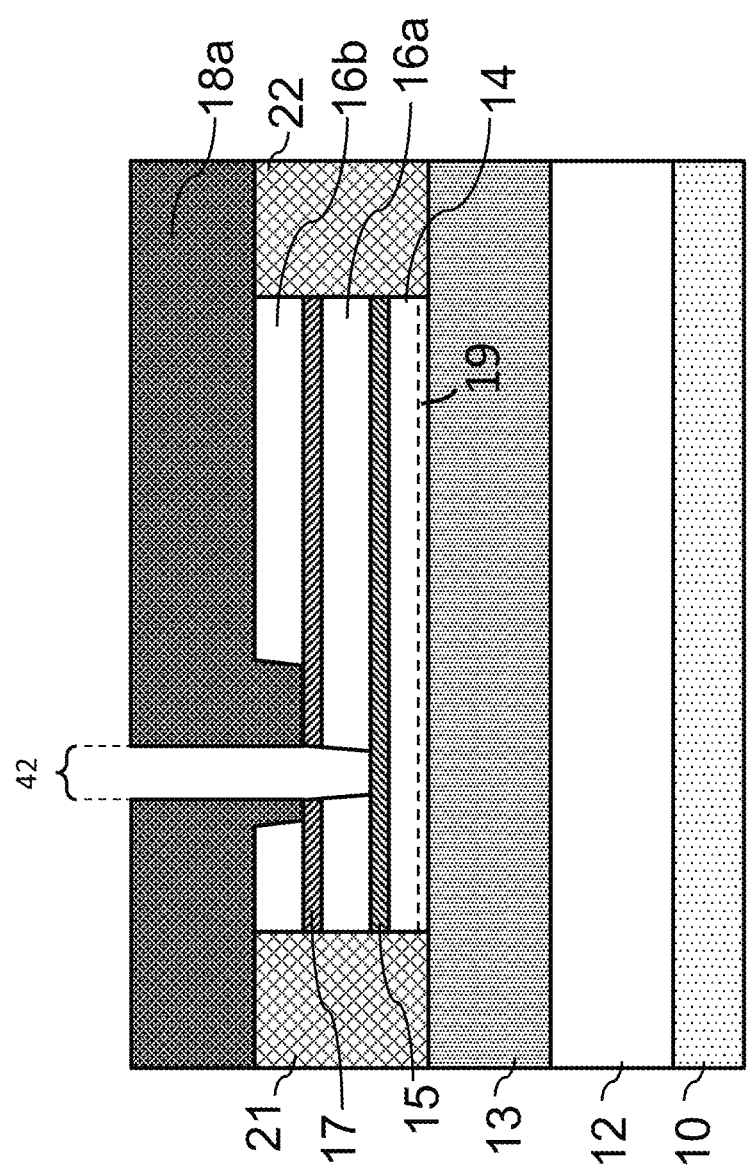

As seen in FIG. 4C, a second masking layer 18*b* is patterned over the top surface of the device to create an opening which is inset to first recess 41. The III-N insertion layer 15 and the III-N cap layer 16*a* is removed in the opening to create a second recess 42, exposing a top surface of III-N top barrier layer 15. In actual practice, the order of forming first recess 41 and the second recess 42 may be switched to accommodate ease of manufacturability. Although not shown, the III-N top barrier layer 15 may be left in place or it may be removed in the bottom portion of the recess 42 exposing a surface of the channel layer 14, prior to the placement of the gate electrode.

Figure 4D:
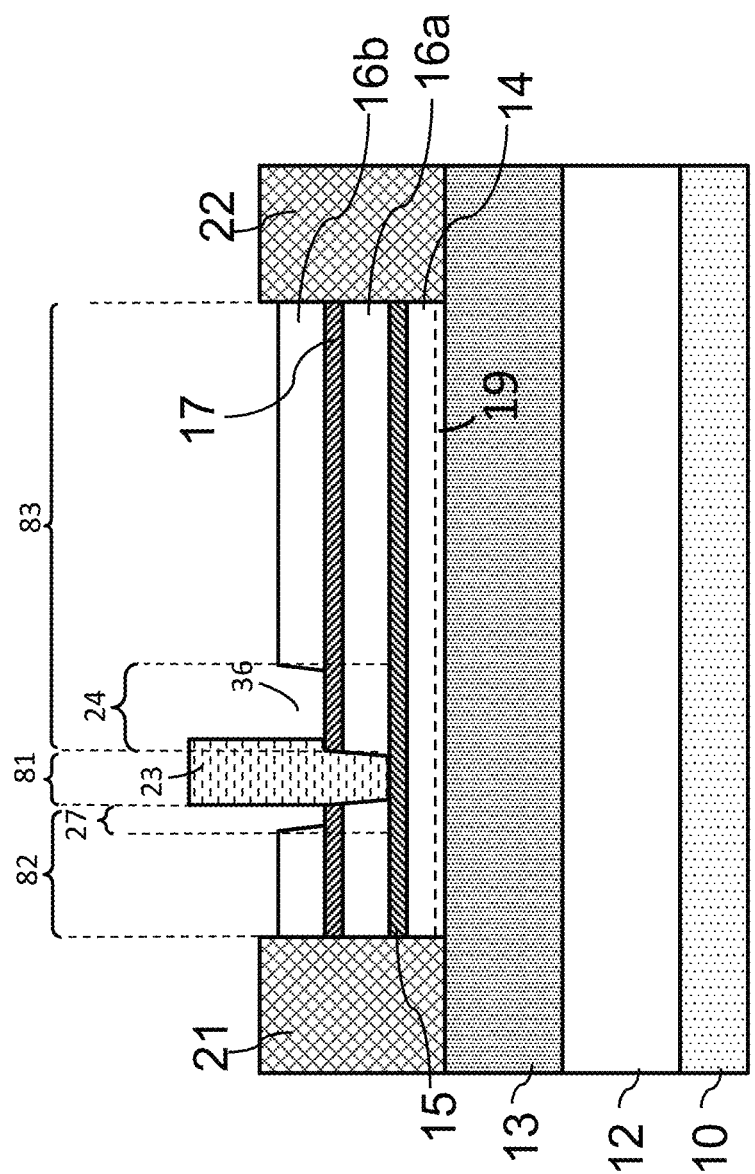

Next, as seen in FIG. 4D, gate contact 23 is formed at least partially into the recess in the III-N cap layer 16 and at a minimum the gate contact 23 is over a portion of the bottom surface of the recess, although it may additionally be formed over a portion of the III-N cap layer 16 in the region 24 as shown in FIG. 4D and a optionally over a portion of the III-N cap layer 16 in the region 27. Although not shown in FIG. 4C and FIG. 4D, the process of forming the recess 42 in the III-N cap layer 16 can also involve the full or partial removal of the III-N top barrier layer 15 and the partial removal III-N channel layer 14. The remaining thickness of the III-N channel layer 14 determines the capacitance between the channel (e.g., 2DEG) and the gate contact. The thickness of the remaining layer 14 and 15 determine the pinch-off voltage of the 2DEG channel under the gate contact 23. Although the formation of only two recesses is shown, there is no limitation to the number of recesses (i.e., steps) in the III-N cap layer 16 which can be formed in this manner.

Another configuration for a III-N device is shown in FIG. 5. The device 500 of FIG. 5 is similar to the device 300 of FIG. 3 but includes additional III-N insertion layers 17 compared to those shown in FIG. 3. These additional layers provide the ability to further engineer the charge profile in the 2DEG channel 19 by creating a multi-stepped recess 56. The composition, thickness, polarization and/or doping of each III-N insertion layer may be similar or may be different. For example, the thickness of each III-N insertion layer can progressively decrease in thickness as it moves away from the III-N channel layer 14. The device 300 of FIG. 3 depicts three III-N insertion layers, however there is no restriction on the number of III-N insertion layers 17 that can be used to create the stepped structure in the III-N cap layer 16 (comprising cap layers 16*a*, 16*b*, 16*c*, and 16*d* with insertion layers 17 between adjacent cap layers).

The formation of the multi-stepped recess 56 creates a stepped profile into the III-N cap layer 16, so as to form cap layers 16*a*, 16*b*, 16*c*, and 16*d*. Moving up from bottom to the top of the stepped profile in the drain-side access region 83, the length of the top surface of each step can progressively decrease, which can help to reduce the on-resistance of the device by increasing the channel charge for a wider portion of the drain-side access region 83, while simultaneously reducing the peak electric fields near the gate 23. The width for each subsequent step moving up the structure may be asymmetric with different top surface lengths on the source-side access region 82 compared to the drain-side access region 83. For example, the width of the top surface in the source-side access region can be less than the corresponding width of the top surface in the drain-side access region, Following the formation of the multi-stepped recess 56, a passivating gate dielectric 55 may be regrown or deposited across the top surface of the III-N cap layer 16 between the source and drain and in the multi-stepped recess 56. The gate dielectric layer 55 can also include a portion which covers the bottom surface of the recess 26 which is between the gate contact 23 and the III-N top barrier layer 15. The gate electrode will cover a portion of the deepest etched trench although it can also be deposited such that the gate metal overlaps onto one or more additional steps. Following the formation of each step semiconductor or dielectric material may optionally be regrown or deposited within the etched trench. This includes the deposition of a gate dielectric material and/or a III-N layer.

FIG. 6 shows a device 600 which is another configuration of the present invention. The device 600 is a high-frequency device constructed using a T-gate electrode 63, which is formed in the recess of the III-N cap layer 66. Device 600 includes a passivated gate dielectric 65 which extends across the top surface of the III-N cap layer between the source and drain. The passivation layer can also include a portion which covers the sidewalls of the gate electrode 63. The passivation layer can be formed my means of metal organic chemical vapor deposition (MOCVD) or by means of plasma enhanced chemical vapor deposition (PECVD) or a combination thereof.

Figure 7:
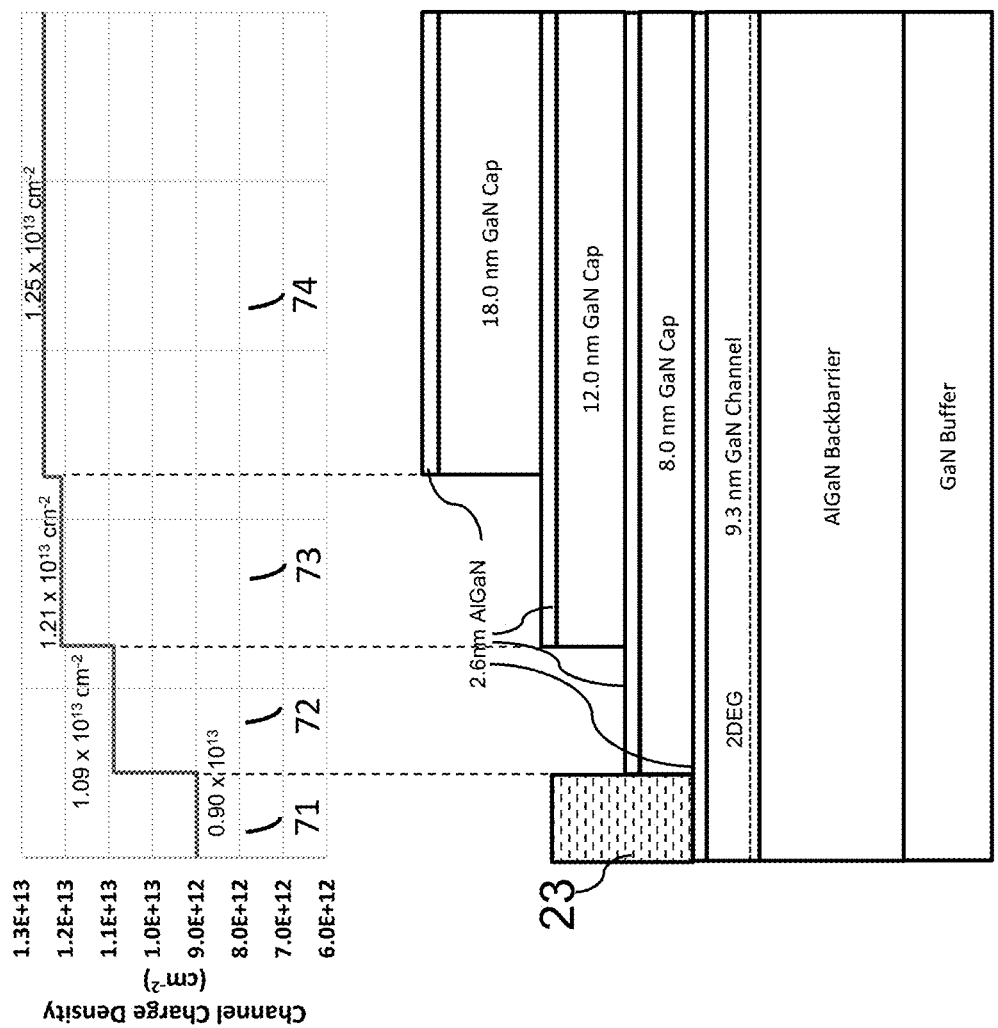
FIG. 7 is an illustration of a portion of a III-N device along with a plot of channel charge density in the device.

FIG. 7 shows an example portion of a device with a stepped (second) cap layer structure along with a corresponding one dimensional (1D) plot of the channel charge density profile corresponding to the device structure. The thickness of each step in the GaN Cap layer in FIG. 7 increases from 8 nm to 12 nm to 18 nm, moving up from the GaN channel layer, creating a total GaN thickness of 38 nm above the GaN channel layer. Repeating 2.6 nm thick AlGaN insertion layers (e.g., $Al_xGa_{1-x}N$ with x between 0.2 and 0.5) are present between each GaN cap step layer. Region 71 of FIG. 7 shows a channel charge density of $0.90 \times 10^{13}$ $cm^{-2}$, which corresponds with the region underneath the gate contact 23 which is fully recessed in the GaN cap layer. Region 72 shows a channel charge density of $1.09 \times 10^{13}$ $cm^{-2}$, which corresponds with the region of the GaN cap layer with a total thickness of 8 nm above the GaN channel. Region 73 shows a channel charge density of $1.21 \times 10^{13}$ $cm^{-2}$, which corresponds with the region of the GaN cap layer with a total thickness of 20 nm above the GaN channel layer. Region 74 shows a channel charge density of $1.25 \times 10^{13}$ $cm^{-2}$, which corresponds with the region of the GaN cap layer with a total thickness of 38 nm above the GaN channel layer. As shown in the example of FIG. 7, the total channel charge density near the gate contact 23 can be reduced by more than 20% compared to the channel charge density in the region of the channel which has the total GaN cap layer thickness. The reduction of the channel charge density near the gate can reduce the peak electric field in drain-side access region, and increase the overall device breakdown voltage.

Figure 8:
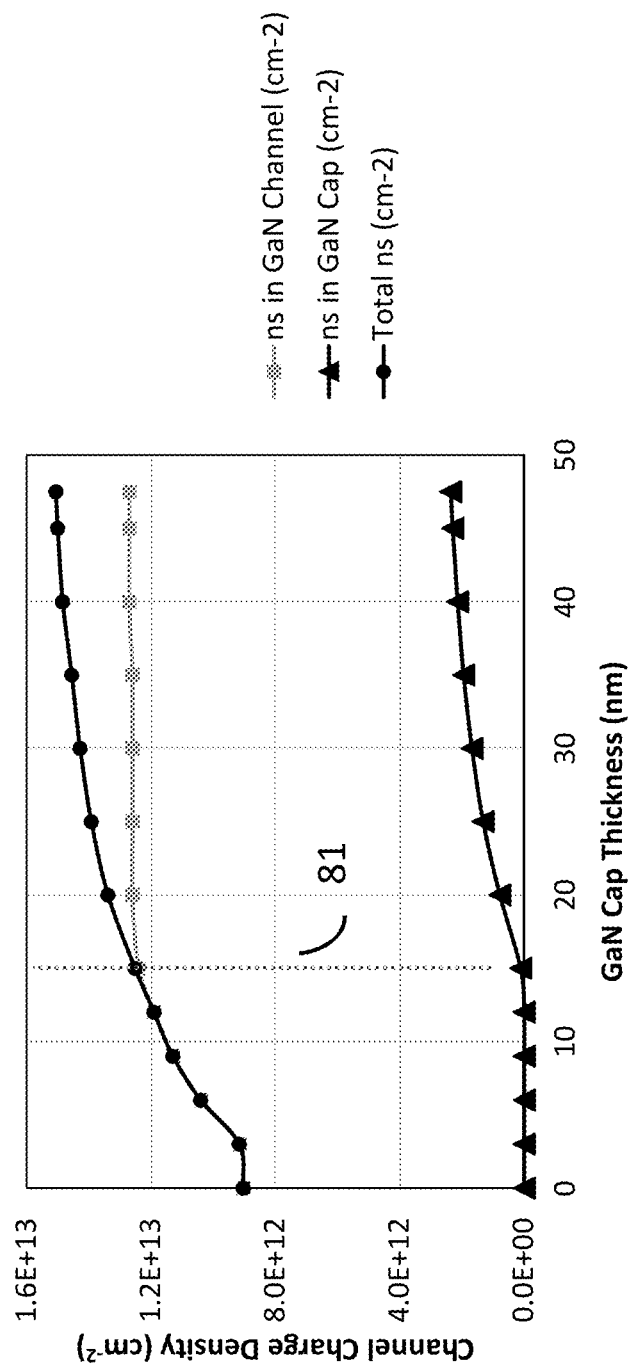
FIG. 8 is a plot of charge density versus GaN cap thickness for devices disclosed herein.

FIG. 8 is a plot which shows how the channel change density in the 2DEG GaN channel 19 and the GaN cap 16 changes, as the overall total thickness of the GaN cap layer 16 is increased from 0 nm to 50 nm. FIG. 8 is an example of channel charge density for a GaN cap layer which does not include any III-N insertion layers, such as layer 17. As seen by dashed line 81 in FIG. 8, once the GaN cap reaches a critical thickness, in this case ~15 nm, the additional $n_s$ created into the GaN channel becomes saturated, and any additional total $n_s$ created by increasing the GaN cap layer beyond the saturation point is concentrated in the GaN cap layer.

Embodiments

1. A1. An embodiment can include a III-N device, comprising:
a III-N channel layer (14) over an N-face of a III-N barrier layer (13), the III-N channel layer having a smaller bandgap than the III-N barrier layer;
a first III-N cap layer (15) over an N-face of the III-N channel layer, the first III-N cap layer having a larger bandgap than the III-N channel layer;
a second III-N cap layer (16) over an N-face of the first III-N cap layer, wherein a portion of the second III-N cap layer adjacent to the first III-N cap layer has a smaller bandgap than the first III-N cap layer;
a gate contact (23) between a source (21) and a drain contact (22), and the gate contact is at least partially in a recess (36) in the second III-N cap layer; wherein
the second cap layer includes a first region (24) and a second region (25), wherein the first region has a first end (34) in contact with the gate contact and directly adjacent to a bottom surface of the recess (26) and a second end (35) between the first end and the drain contact, and the second region is directly adjacent to the first region and is between the first region and the drain contact;
a thickness of the second cap layer in the first region (24) is everywhere less than a thickness of the second cap layer in the second region (25); and
a lateral separation (84) between the first end and the second end is greater than 25 nanometers.

A2. The embodiment of A1, wherein the recess includes a sidewall proximal to the drain contact, and the gate contact is in contact with a first section of the sidewall but not to a second section of the sidewall.

A3. The embodiment of A2, further comprising a gate dielectric layer (55) between the gate contact and the sidewall of the recess.

A4. The embodiment of A1, wherein the recess includes a sidewall proximal to the drain contact, and the sidewall includes a plurality of steps.

A5. The embodiment of A1, wherein the thickness of the second cap layer in the first region increases monotonically from the first end to the second end.

A6. The embodiment of A1, wherein the recess includes a sidewall proximal to the drain contact, and the first region of the second III-N cap layer is directly below the sidewall of the recess.

A7. The embodiment of A1, wherein the second III-N cap layer comprises alternating layers of GaN (16) and AlGaN (17).

A8. The embodiment of A1, wherein the second III-N cap layer comprises multiple layers of different III-N materials.

2. A9. The embodiment of A1, wherein the III-N channel layer comprises GaN.

A10. The embodiment of A9, wherein the first III-N cap layer comprises, AlGaN, AlGaInN, AlN or AlInN.

A11. The embodiment of A10, wherein the second III-N cap layer comprises GaN.

A12. The embodiment of A1, wherein the second III-N cap layer comprises GaN.

A13. An embodiment can include an electronic device, comprising:
a III-N material structure comprising a III-N channel layer (14) over a III-N barrier layer (13) and a III-N cap layer (16) over the III-N channel layer, wherein a compositional difference between the III-N barrier layer and the III-N channel layer causes a 2DEG channel (19) to be induced in the III-N channel layer; and
a gate contact (23) between a source (21) and a drain contact (22), wherein the gate contact is over an N-face of the III-N material structure and is at least partially in a recess (36) in the III-N cap layer; wherein
the III-N material structure in a drain-side access region (83) of the device includes a first region (24) and a second region (25), wherein the first region has a first end (34) in contact with the gate and directly adjacent to a bottom surface (26) of the recess and a second end (35) between the first end and the drain contact, and the second region is directly adjacent to the first region and is between the first region and the drain contact;
a thickness of the III-N cap layer (16) in the first region (24) is everywhere less than a thickness of the III-N cap layer (16) in the second region (25); and
a charge density of the 2DEG channel (19) in the first region is everywhere less than a charge density of the 2DEG channel in the second region.

A14. The embodiment of A13, wherein the charge density of the 2DEG channel in the first region increases monotonically from a first charge density at the first end to a second charge density at the second end.

A15. The embodiment of A14, wherein the second charge density is at least 1.1 times the first charge density.

A16. The embodiment of A13, wherein the III-N cap layer is thicker in the second region than at the first end of the first region.

A17. The embodiment of A13, further comprising a gate dielectric layer between the gate contact the first end of the first region.

A18. The embodiment of A17, wherein the III-N material structure further comprises an AlGaN layer between the III-N channel layer and the III-N cap layer, and the gate dielectric layer is between the gate contact and the AlGaN layer.

A19. The embodiment of A13, wherein the charge density of the 2DEG channel increases monotonically from the gate contact to the source contact.

A device according to one or more of the embodiments A1-A19, comprising a cap layer including the first cap layer and the second cap layer, wherein the cap layer is etched (by using a timed or controlled etch) to form the shape (e.g., steps) of the first region, the second region and the recess.

Various example devices described herein are III-N (e.g. GaN) devices having a stepped cap layer over the channel of the device, for which the III-N material is orientated in an N-polar orientation. The III-N device includes a III-N channel layer over an N-face of a III-N barrier layer, the III-N channel layer having a smaller bandgap than the III-N barrier layer. The device further includes a first III-N cap layer over an N-face of the III-N channel layer, the first III-N cap layer having a larger bandgap than the III-N channel layer. The device further includes a second III-N cap layer over an N-face of the first III-N cap layer, where a portion of the second III-N cap layer adjacent to the first III-N cap layer has a smaller bandgap than the first III-N cap layer. The device further includes a gate contact between a source and a drain contact, and the gate contact is at least partially in a recess in the second III-N cap layer. The second cap layer includes a first region and a second region, where the first region has a first end in contact with the gate contact and directly adjacent to a bottom surface of the recess and a second end between the first end and the drain contact, and the second region is directly adjacent to the first region and is between the first region and the drain contact. The thickness of the second cap layer in the first region is everywhere less than a thickness of the second cap layer in the second region, and a lateral separation between the first end and the second end is greater than 25 nanometers.

B1. An example method of forming a III-N device, comprising:

providing a III-N material structure comprising a III-N channel layer over an N-face of a III-N barrier layer, wherein the III-N channel layer has a smaller bandgap than the III-N barrier layer;

forming a first III-N cap layer over an N-face of the III-N material structure, and forming a second III-N cap layer over an N-face of the first III-N cap layer, wherein the second III-N cap layer has a smaller bandgap than the first III-N cap layer;

forming a source contact and a drain contact to the III-N material structure;

patterning a masking layer over the second III-N cap layer, the masking layer including an opening between the source contact and the drain contact; and etching the second III-N cap layer below the opening in the masking layer to form a recess therein; and depositing a gate contact at least partially in the recess; wherein the second cap layer includes a first region and a second region, wherein the first region has a first end in contact with the gate contact directly adjacent to a bottom surface of the recess and a second end between the first end and the drain contact, and the second region is directly adjacent to the first region and is between the first region and the drain contact;

the thickness of the second III-N cap layer increases monotonically from the first end to the second end; and a lateral separation between the first end and the second end is at least 25 nanometers.

B2. The example method of B1, further comprising forming a gate dielectric layer over a top surface of the second III-N cap layer in the recess, wherein the gate contact is deposited over the gate dielectric layer.

B3. The example method of B1, wherein the first III-N cap layer comprises AlGaN and the second III-N cap layer comprises GaN.

B4. The example method of claim B3, wherein the second III-N cap layer comprises alternating layers of GaN and AlGaN.

B4. The example method of B4, wherein the recess includes a sidewall proximal to the drain contact, and the sidewall includes a plurality of steps.

B5 The example method of any of the examples B1-B4, wherein the first cap layer and the second cap layer form a cap layer, the method further comprising performing a timed etch of the cap layer so as to form a shape of the first region, the second region and the recess.

REFERENCES

The following references are incorporated by reference herein.

[1] B. Romanczyk, S. Wienecke, M. Guidry, H. Li, E. Ahmadi, X. Zheng, S. Keller, and U. K. Mishra, "Demonstration of Constant 8 W/mm Power Density at 10, 30, and 94 GHz in State-of-the-Art Millimeter-Wave N-Polar GaN MISHEMTs," *IEEE Trans. Electron Devices*, vol. 65, no. 1, pp. 45-50, 2018, doi: 10.1109/TED.2017.2770087.

[2] S. Wienecke, B. Romanczyk, M. Guidry, H. Li, E. Ahmadi, K. Hestroffer, X. Zheng, S. Keller, and U. K. Mishra, "N-polar GaN cap MISHEMT with record power density exceeding 6.5 W/mm at 94 GHz," *IEEE Electron Device Lett.*, vol. 38, no. 3, pp. 359-362, 2017, doi: 10.1109/led.2017.2653192.

[3] Y. F. Wu, M. Moore, A. Saxler, T. Wisleder, and P. Parikh, "40-W/mm Double Field-plated GaN HEMTs," in 64th *Device Research Conference*, 2006, pp. 151-152, doi: 10.1109/DRC.2006.305162.

A number of implementations have been described. Nevertheless, it will be understood that various modifications may be made without departing from the spirit and scope of the techniques and devices described herein. It is intended that the scope of the invention be limited not by this detailed description, but rather by the claims appended hereto.

What is claimed is:

1. A III-N device, comprising:
a III-N channel layer over an N-face of a III-N barrier layer, the III-N channel layer having a smaller bandgap than the III-N barrier layer;
a first III-N cap layer over an N-face of the III-N channel layer, the first III-N cap layer having a larger bandgap than the III-N channel layer;
a second III-N cap layer over an N-face of the first III-N cap layer, wherein a portion of the second III-N cap layer adjacent to the first III-N cap layer has a smaller bandgap than the first III-N cap layer;
a gate contact between a source contact and a drain contact, and the gate contact is at least partially in a recess in the second III-N cap layer; wherein
the second III-N cap layer includes a first region and a second region, wherein the first region has a first end in contact with the gate contact and directly adjacent to a bottom surface of the recess and a second end between the first end and the drain contact, and the second region is directly adjacent to the first region and is between the first region and the drain contact;
a first thickness of the second III-N cap layer in the first region is everywhere less than a second thickness of the second III-N cap layer in the second region so that a charge density of a 2DEG channel below the first region is everywhere less than a charge density of the 2DEG channel below the second region;
the first end comprises a sidewall of the first thickness in contact with the gate contact; and
a lateral separation between the first end and the second end is greater than 25 nanometers.

2. The device of claim 1, wherein the recess includes a sidewall proximal to the drain contact, and the gate contact is in contact with a first section of the sidewall but not to a second section of the sidewall.

3. The device of claim 2, further comprising a gate dielectric layer between the gate contact and the sidewall of the recess.

4. The device of claim 1, wherein the first thickness of the second III-N cap layer in the first region increases monotonically from the first end to the second end.

5. The device of claim 1, wherein the recess includes a sidewall proximal to the drain contact, and the first region of the second III-N cap layer is directly below the sidewall of the recess.

6. The device of claim 1, wherein the second III-N cap layer comprises alternating layers of GaN and AlGaN.

7. The device of claim 1, wherein the second III-N cap layer comprises multiple layers of different III-N materials.

8. The device of claim 1, wherein the III-N channel layer comprises GaN.

9. The device of claim 8, wherein the first III-N cap layer comprises AlGaN, AlGaInN, AN or AlInN.

10. The device of claim 1, wherein the second III-N cap layer comprises GaN.

11. The device of claim 1, further comprising a cap layer including the first III-N cap layer and the second III-N cap layer, wherein the cap layer is etched to form a shape of the first region, the second region and the recess.

12. An electronic device, comprising:
a III-N material structure comprising a III-N channel layer over a III-N barrier layer and a III-N cap layer over the III-N channel layer, wherein a compositional difference between the III-N barrier layer and the III-N channel layer causes a 2DEG channel to be induced in the III-N channel layer; and
a gate contact between a source contact and a drain contact, wherein the gate contact is over an N-face of the III-N material structure and is at least partially in a recess in the III-N cap layer; wherein
the III-N cap layer in a drain-side access region of the device includes a first region and a second region, wherein the first region has a first end in contact with the gate contact and directly adjacent to a bottom surface of the recess and a second end between the first end and the drain contact, and the second region is directly adjacent to the first region and is between the first region and the drain contact;
a first thickness of the III-N cap layer in the first region is everywhere less than a second thickness of the III-N cap layer in the second region so that a charge density of the 2DEG channel below the first region is everywhere less than a charge density of the 2DEG channel below the second region; and
the first end comprises a sidewall of the first thickness in contact with the gate contact.

13. The electronic device of claim 12, wherein the charge density of the 2DEG channel in the first region increases monotonically from a first charge density at the first end to a second charge density at the second end.

14. The electronic device of claim 13, wherein the second charge density is at least 1.1 times the first charge density.

15. The electronic device of claim 12, wherein the III-N cap layer is thicker in the second region than at the first end of the first region.

16. The electronic device of claim 12, further comprising a gate dielectric layer between the gate contact and the first end of the first region.

17. The electronic device of claim 16, wherein the III-N material structure further comprises an AlGaN layer between the III-N channel layer and the III-N cap layer, and the gate dielectric layer is between the gate contact and the AlGaN layer.

18. The electronic device of claim 12, wherein the charge density of the 2DEG channel increases monotonically from the gate contact to the source contact.

19. The device of claim 1, wherein the recess includes a sidewall proximal to the drain contact, and the sidewall includes a plurality of steps.

20. A method of making a III-N device, comprising:
providing a III-N channel layer over an N-face of a III-N barrier layer, the III-N channel layer having a smaller bandgap than the III-N barrier layer;
forming a first III-N cap layer over an N-face of the III-N channel layer, the first III-N cap layer having a larger bandgap than the III-N channel layer;
forming a second III-N cap layer over an N-face of the first III-N cap layer, wherein a portion of the second III-N cap layer adjacent to the first III-N cap layer has a smaller bandgap than the first III-N cap layer;
depositing a gate contact between a source contact and a drain contact, the gate contact at least partially in a recess in the second III-N cap layer; wherein:
the second III-N cap layer includes a first region and a second region, wherein the first region has a first end in contact with the gate contact and directly adjacent to a bottom surface of the recess and a second end between the first end and the drain contact, and the second region is directly adjacent to the first region and is between the first region and the drain contact;
a first thickness of the second III-N cap layer in the first region is everywhere less than a second thickness of the second III-N cap layer in the second region so that a charge density of a 2DEG channel below the first region is everywhere less than a charge density of the 2DEG channel below the second region;
the first end comprises a sidewall of the first thickness in contact with the gate contact; and
a lateral separation between the first end and the second end is greater than 25 nanometers.

21. The method of claim 20, wherein:
the recess includes a sidewall proximal to the drain contact, and the gate contact is in contact with a first section of the sidewall but not to a second section of the sidewall, and
the method further comprises forming a gate dielectric layer between the gate contact and the sidewall of the recess.

22. The method of claim 20, wherein the second III-N cap layer comprises alternating layers of GaN and AlGaN.

23. The method of claim 20 , wherein the III-N channel layer comprises GaN and the first III-N cap layer comprises AlGaN, AlGaInN, AN or AlInN.

24. The method of claim 20, wherein the second III-N cap layer comprises GaN.

25. The method of claim 20, wherein the recess includes a sidewall proximal to the drain contact, and the sidewall includes a plurality of steps.

* * * * *